(12) United States Patent
Kim et al.

(10) Patent No.: US 6,812,578 B2
(45) Date of Patent: Nov. 2, 2004

(54) SEMICONDUCTOR DEVICE BONDING PAD RESISTANT TO STRESS AND METHOD OF FABRICATING THE SAME

(75) Inventors: Shin Kim, Chungcheongnam-do (KR); Tae-Gyeong Chung, Kyungki-do (KR); Nam-Seog Kim, Chungcheongnam-do (KR); Woo-Dong Lee, Chungcheongnam-do (KR); Jin-Hyuk Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/068,628

(22) Filed: Feb. 6, 2002

(65) Prior Publication Data

US 2002/0113313 A1 Aug. 22, 2002

(30) Foreign Application Priority Data

Feb. 21, 2001 (KR) .......................................... 2001-8758

(51) Int. Cl.[7] .......................... H01L 23/48; H01L 23/52; H01L 29/40
(52) U.S. Cl. .......................... 257/780; 257/754; 257/755
(58) Field of Search .................................. 257/751–759, 257/780–786, 773–775, 736, 750, 705, 787, 788, 760; 438/612, 70; 361/767, 776–777, 795; 174/250–254, 257–265; 29/841–843

(56) References Cited

U.S. PATENT DOCUMENTS

| 4,984,056 | A | * | 1/1991 | Fujimoto et al. | ........... 257/753 |
| 5,036,383 | A | * | 7/1991 | Mori | ........... 257/751 |
| 5,723,822 | A | * | 3/1998 | Lien | ........... 174/250 |
| 5,734,200 | A | * | 3/1998 | Hsue et al. | ........... 257/755 |
| 5,773,899 | A | * | 6/1998 | Zambrano | ........... 257/341 |
| 5,859,456 | A | * | 1/1999 | Efland et al. | ........... 257/211 |
| 6,204,454 | B1 | * | 3/2001 | Gotoh et al. | ........... 174/255 |
| 6,307,264 | B1 | * | 10/2001 | Fukumoto | ........... 257/249 |
| 6,369,409 | B1 | * | 4/2002 | Takasu et al. | ........... 257/60 |

* cited by examiner

*Primary Examiner*—David A. Zarneke
*Assistant Examiner*—Tuan Dinh
(74) *Attorney, Agent, or Firm*—Marger Johnson & McCollom, P.C.

(57) ABSTRACT

According to various embodiments of the present invention, a bonding pad structure of a semiconductor device reduces damage caused by thermo-mechanical stress in beam lead bonding. A method of fabricating an improved bonding pad structure is also provided. A polysilicon film plate is preferably formed between a bonding pad metal layer and a dielectric layer. The polysilicon film plate absorbs external thermo-mechanical stress and improves the durability of the bonding pad in a bond pull test (BPT). The bonding between the bonding pad metal layer and the dielectric layer is also improved. Other features and advantages are also provided.

15 Claims, 4 Drawing Sheets

SEMICONDUCTOR DEVICE BONDING PAD RESISTANT TO STRESS AND METHOD OF FABRICATING THE SAME

This application claims priority from Korean Patent Application No. 2001-8758, filed Feb. 21, 2001, the contents of which are hereby incorporated herein by reference in their entirety.

BACKGROUND OF THE INVENTION

1. Field of the Invention

The present invention relates generally to a semiconductor device comprising a bonding pad and a method of fabricating the same. More particularly, the present invention relates to a bonding pad of a semiconductor device and a method of fabricating the same.

2. Description of Related Art

A bonding pad is a terminal that connects integrated circuit patterns formed on a semiconductor chip to an external device. A semiconductor packaging process includes wire bonding to connect the bonding pad to a lead or solder ball. The lead or solder ball provides an external connection terminal of a semiconductor package and is typically used to connect to an external device through a gold wire. The external connection terminals of the semiconductor package are mounted on a printed circuit board that utilizes the semiconductor package.

In most wire bonding methods, a ball bond is formed as a first bond on the bonding pad of a semiconductor chip. A stitch bond is formed as a second bond either on an inner lead of a lead frame or on a substrate having a printed circuit board formed thereon. However, a particular wire bonding process, known as beam lead bonding, is generally used in highly-integrated semiconductor packages, such as a chip scale package (CSP). A representative semiconductor package using this beam lead bonding technique is a Micro-Ball Grid Array ($\mu$-BGA) package, such as one developed by Tessera, Inc.

In the beam lead bonding process, a bonding tool is used to compress a gold-plated copper beam lead onto the bonding pad. The compression bonding is typically thermocompression bonding. Unfortunately, beam lead bonding asserts a greater mechanical force on the bonding pad than conventional wire bonding, and thereby causes increased mechanical stress in the bonding pad.

FIG. 1 is a cross-sectional view of a bonding pad illustrating a beam lead bond on a bonding pad of a conventional semiconductor device. FIG. 2 is a plan view of a metal open defect that occurs when a bond pull test (BPT) is performed on the beam lead bonded bonding pad.

Referring first to FIG. 1, a bonding pad 20 is formed on a semiconductor substrate 2. The bonding pad 20 typically includes a substructure 4 that carries out the same functions as a semiconductor memory. The substructure 4 is formed on a semiconductor substrate 2. A dielectric layer 6 is formed on the substructure 4 and a metal layer 8 is formed on the dielectric layer 6. Beam lead wire bonding is performed on the metal layer 8. After the beam lead bonding is performed, a temperature cycling test is performed for a predetermined time. A BPT is then performed to verify the reliability of the beam lead bonding.

The temperature cycling test is a reliability test to check for physical and electrical defects in a semiconductor device. In the temperature cycling test, the temperature of the semiconductor device is repeatedly raised and lowered between about −65~150° C. in a closed chamber. The BPT is a reliability test used to check the amount of separation force required to separate the bonding wire from the bonding pad. The BPT is also used to analyze a separation portion of the beam lead 30 and to check the normal performance of a beam lead bonding. The BPT is performed by pulling the beam lead 30 up with a predetermined force to determine the adhesiveness between the beam lead 30 and the surface of the bonding pad 20.

As illustrated in FIG. 1, if the beam lead 30 is properly wire-bonded, the beam lead 30 detaches from the surface of the bonding pad 20 at points A and B. If the beam lead 30 wire bonding is defective, however, the beam lead 30 detaches from the surface of the bonding pad 20 at point C or a metal open failure occurs at point D and the metal layer 8 underneath the bonding pad 20 detaches. In other words, during the BPT, the beam lead 30 may detach at point C if it is not compressed properly to the surface of the bonding pad 20. The metal layer 8 detaches at point D if adhesion between the metal layer 8 and the dielectric layer 6 of the bonding pad 20 is weak, if the bonding pad 20 is mechanically stressed by the beam lead bonding to the point that delamination occurs between the dielectric layer 6 and the metal layer 8, or if the dielectric layer 6 is broken.

With reference to FIG. 2, on the left of FIG. 2, the beam lead 30 is shown bonded to the bonding pad 20 of the semiconductor substrate 10. On the right of FIG. 2, the metal layer 8 is shown detached from the bonding pad 20 due to a metal open defect occurring during a BPT. The metal open defect, generated in a $\mu$-BGA package, caused by poor adhesiveness of the layers on a semiconductor substrate, causes the semiconductor substrate to be nonfunctional.

Unfortunately, during the BPT test, the beam lead 30 is often either too easily separated from the bonding pad 20, or a defect such as a metal open defect is generated when the stacked layers (substructure 4, the dielectric layer 6, and the metal layer 8) of the bonding pad 20 are poorly adhered to each other.

SUMMARY OF THE INVENTION

To solve the forgoing problems, the present invention provides a bonding pad of a semiconductor device that has improved wire bonding reliability in a semiconductor package where beam lead bonding is performed.

Also, the present invention provides a semiconductor package and a semiconductor package module on which a semiconductor chip having the bonding pad is mounted.

Additionally, the present invention provides a method of fabricating a bonding pad of a semiconductor device that can enhance the reliability of wire bonding in a semiconductor package where beam lead bonding is performed.

Accordingly, a preferred bonding pad of a semiconductor device includes a semiconductor substrate. A substructure is formed on the semiconductor substrate. A first dielectric layer is formed on the substructure. A polysilicon film plate is formed on the first dielectric layer to improve the physical characteristics of the wire bonding. A first metal layer is formed on the polysilicon film plate. A second metal layer formed on the first metal layer.

According to another aspect of this invention, a semiconductor package and a semiconductor package module on which a semiconductor chip having a bonding pad is mounted include a semiconductor substrate. A substructure is formed on the semiconductor substrate. A first dielectric is layer formed on the substructure. A polysilicon film plate is formed on the first dielectric layer to improve the physical characteristics of the bonding pad. A first metal layer is formed on the polysilicon film plate. A second metal layer is formed on the first metal layer.

Preferably, the substructure comprises circuitry that performs the functions of a memory device, such as a DRAM, and the wire bonding is beam lead bonding. The first dielectric layer is preferably a boron phosphor silicate glass (BPSG) layer. The first dielectric layer preferably has a thickness of around 3000–4000 Å. The polysilicon film plate preferably has a thickness of about 1000–2000 Å. The first and second metal layers are preferably formed of aluminum. The first metal layer preferably has a thickness of around 7000–7500 Å and the second metal layer has a thickness of about 8500–9000 Å.

A method of fabricating a bonding pad of a semiconductor device is also provided. According to this method, a polysilicon film plate is formed on a semiconductor substrate to improve physical characteristics of the bonding pad during wire bonding. A second dielectric layer is also formed on the semiconductor substrate on which the polysilicon film plate is formed. An area is etched in which a bonding pad will be formed. A first metal layer is then formed to cover a portion of the second dielectric layer and to contact the polysilicon film plate. An inter-metal dielectric layer (IMD) is formed on the semiconductor substrate on which the first metal layer is formed and an area in which a bonding pad will be formed is etched. A second metal layer is formed to cover a portion of the inter-metal dielectric layer (IMD) and to contact the first metal layer. A passivation layer is formed on the semiconductor substrate on which the second metal layer is formed and the bonding pad area is etched. A first dielectric layer is formed on the substructure before the polysilicon film plate is formed. The polysilicon film plate preferably has a thickness of about 1000–2000 Å. While forming the passivation layer, an oxide layer is preferably formed by high density plasma (HDP) deposition and a nitride layer is formed by PE chemical vapor deposition (PECVD) on the oxide layer.

According to various preferred embodiments of this invention, a polysilicon film plate is formed between a bonding pad metal layer, where a first metal layer contacts a second metal layer, and a first dielectric layer. Due to the presence of the polysilicon film plate, external thermo-mechanical stress is absorbed, and durability against stress in a vertical direction is increased. Also, the bonding of the bonding pad metal layer and the dielectric layer is improved.

BRIEF DESCRIPTION OF THE DRAWINGS

The forgoing and additional objects and advantages of the present invention will become more readily apparent through the following detailed description of preferred embodiments of the present invention, made with reference to the attached drawings, in which.

DESCRIPTION OF PREFERRED EMBODIMENTS

Various embodiments of the present invention will be described in detail hereafter with reference to the attached drawings. It should be noted, however, that these embodiments of the present invention can be modified in various ways that will be apparent to those skilled in the art. The scope of the present invention must therefore not be restricted to the embodiment. These embodiments are provided by way of illustration, and not of limitation, to more completely explain the concepts of the present invention to those skilled in the art.

FIGS. 3A through 3F are cross-sectional views of a semiconductor device bonding pad illustrating a method of constructing the bonding pad according to a preferred embodiment of the present invention, as well as the resulting structure of the bonding pad.

Figure 1:
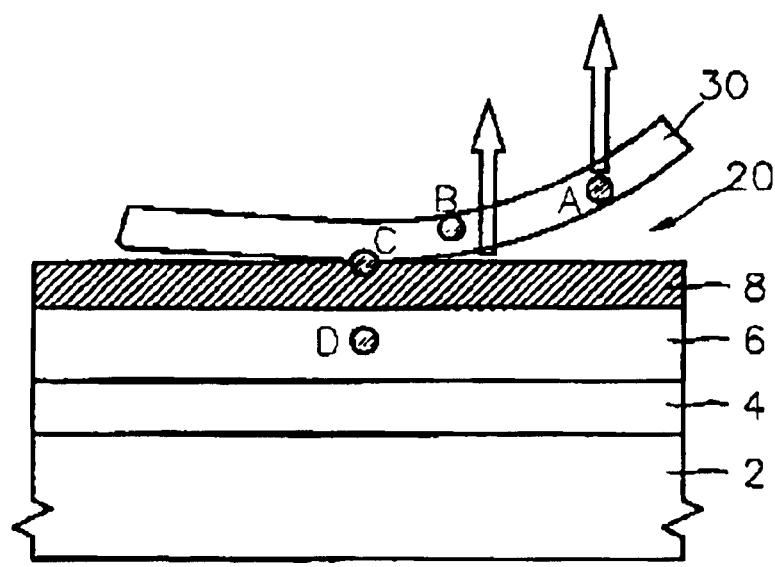
FIG. 1 is a cross-sectional view of a bonding pad of a conventional semiconductor device showing a beam lead bonding structure.
Figure 2:
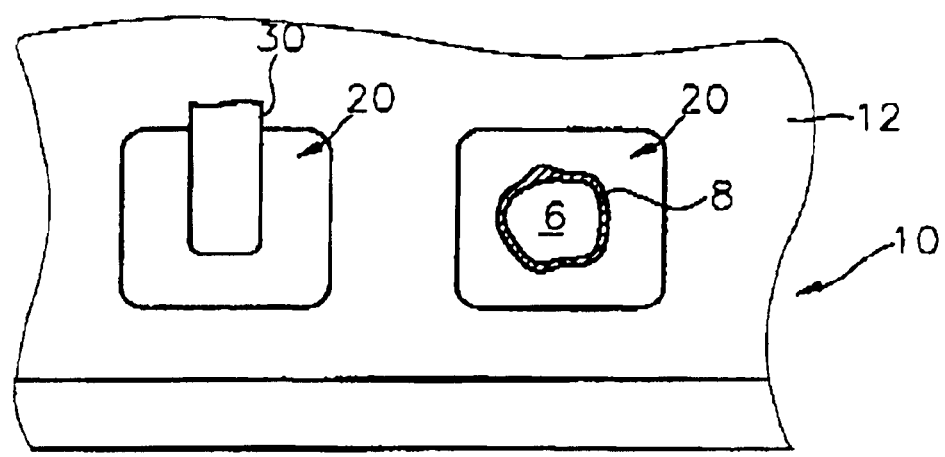
FIG. 2 is a plan view of a normal bonding pad (left) and a bonding pad having a metal open defect (right) generated during a bond pull test (BPT) of the bonding pad using beam lead bonding.
Figure 3A:
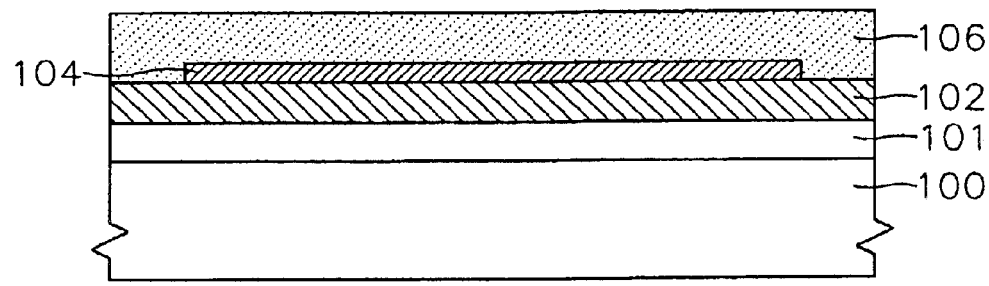
FIGS. 3A through 3F are cross-sectional views of a bonding pad of a semiconductor device constructed according to a preferred embodiment of the present invention.
Figure 3B:
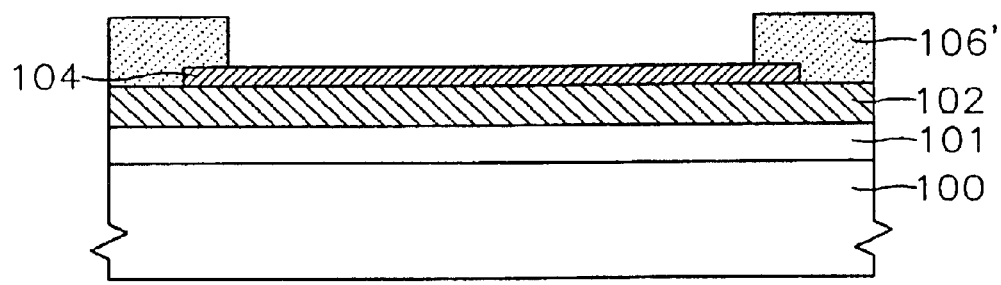
Figure 3C:
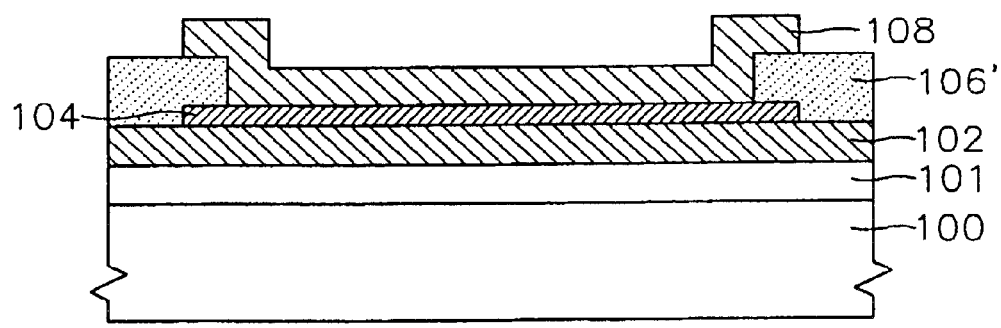
Figure 3D:
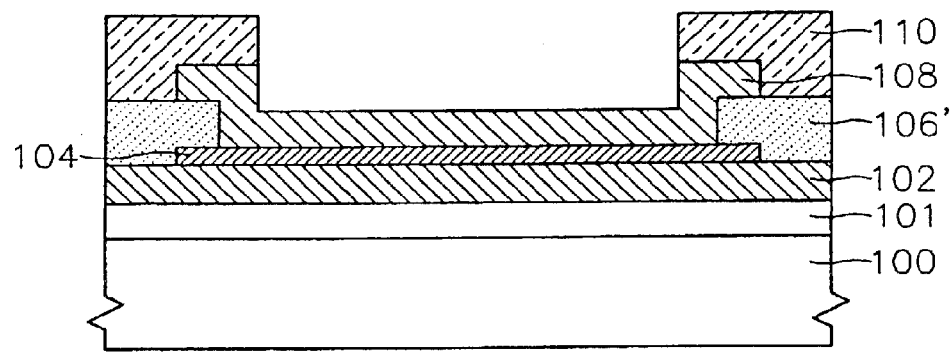
Figure 3E:
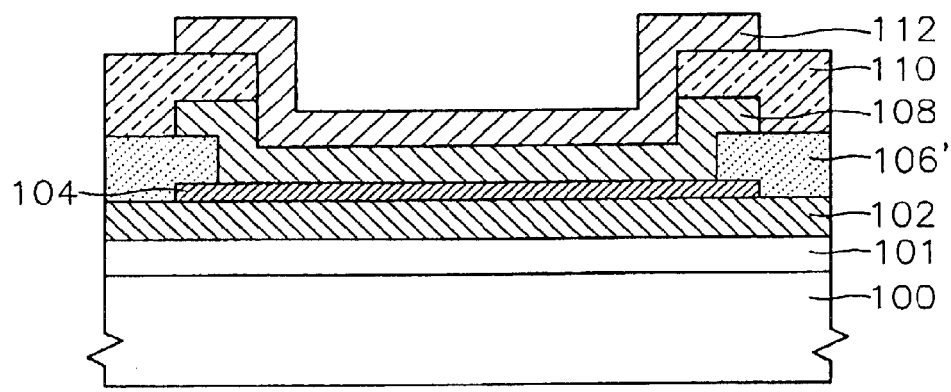
Figure 3F:
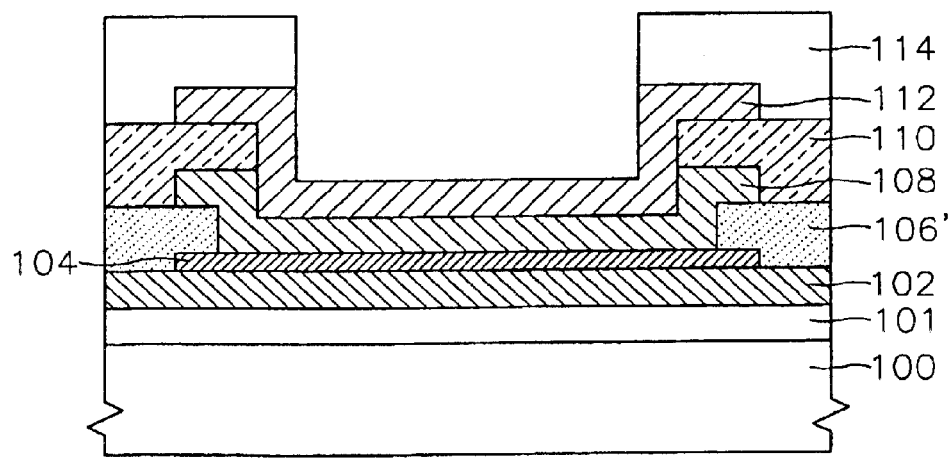

Referring to FIG. 3F, according to a preferred embodiment of the present invention, a semiconductor device bonding pad has a substructure 101 formed on a semiconductor substrate 100. A first dielectric layer 102 is formed on the substructure 101. A polysilicon film plate 104 is formed on the first dielectric layer 102 to improve the physical characteristics of the wire bonding. A first metal layer 108 is formed on the polysilicon film plate 104. A second metal layer 112 is formed on the first metal layer 108.

Reference numerals 106', 110, and 114 denote a second dielectric layer, a inter-metal dielectric layer (IMD), and a passivation layer, respectively. These layers are dielectric layers used to sequentially form the second metal layer 112, the first metal layer 108, and the polysilicon film plate 104.

The polysilicon film plate 104 is a primary tool used to achieve various objects of the present invention. When wire bonding is accompanied by thermo-mechanical stress on the second metal layer 112, such as in beam lead bonding, the polysilicon film plate 104 absorbs a large amount of the stress. In this manner, sliding of the first metal layer 108 and the first dielectric layer 102 is prevented, and their adhesiveness is improved, thereby increasing the durability of the bonding pad against elongated stress in a vertical direction. Structural weaknesses of a bonding pad are thereby reduced and metal open defects are largely prevented.

With reference to FIG. 3A, a substructure 101 configured to carry out integrated circuit functions, such as DRAM functions, is formed on a semiconductor substrate 100 in a conventional manner. A first dielectric layer 102, such as a boron phosphor silicate glass (BPSG) layer, is formed on the substructure 101 to a thickness of about 3000–4000 Å. A polysilicon layer is then formed on the first dielectric layer 102 to a thickness of about 1000–2000 Å and is patterned to form a polysilicon film plate 104. A second dielectric layer 106 is deposited on the polysilicon film plate 104.

Referring to FIG. 3B, a photoresist pattern (not shown) is formed on the second dielectric layer 106. An opening, exposing an area of the polysilicon film plate 104 in which a bonding pad will be formed, is formed by an etching process using the photoresist pattern as an etching mask. The photoresist pattern is subsequently removed.

With reference to FIG. 3C, a metal layer, such as an aluminum layer, is deposited to a thickness of about 7000–7500 Å on the resultant structure. A first metal layer 108 is formed directly on the polysilicon film plate 104, by patterning the metal layer. The polysilicon film plate 104, which is in contact with the first metal layer 108, is metalized through diffusion from the first metal layer 108.

Referring to FIG. 3D, an inter-metal dielectric layer 110 (IMD) is deposited on the entire surface of the semiconductor substrate on which the first metal layer 108 is formed. A photoresist pattern (not shown) is formed on the inter-metal dielectric layer 110 and an opening is formed using the photoresist pattern as an etching mask to expose the first metal layer 108. The photoresist pattern is removed by conventional techniques such as plasma ashing.

With reference to FIG. 3E, another metal layer, such as an aluminum layer, is formed to a thickness of about 8500–9000 Å on the resultant structure having the opening. A second metal layer 112 is then formed in direct contact with the exposed portion of the first metal layer 108 by patterning this metal layer. The second metal layer 112 provides the topmost metal layer and is arranged in contact with a beam lead (not shown) by thermo-compression bonding in a subsequent wire bonding process.

Referring to FIG. 3F, a passivation layer 114 is formed on the second metal layer 112. The passivation layer 114 may be, for example, a double layer including a high density plasma (HDP) oxide layer and a PECVD nitride layer. A photoresist pattern (not shown) is formed on the passivation layer 114. A bonding pad that exposes the second metal layer 112 is formed by etching a portion of the passivation layer 114 using the photoresist pattern as an etching mask.

Figure 4:
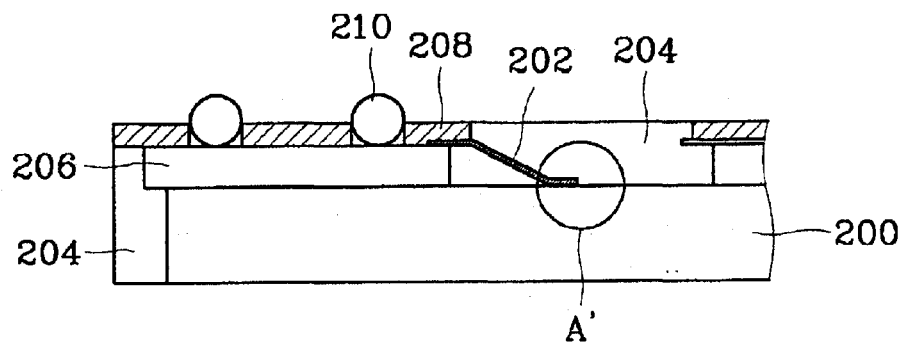
FIG. 4 is a cross-sectional view of a semiconductor package on which a semiconductor chip having a bonding pad constructed according to FIGS. 3A–3F is mounted according to another aspect of the present invention.

FIG. 4 shows a cross-sectional view of a semiconductor package on which a semiconductor chip having the bonding pad of the present invention is mounted. Referring to FIG. 4, a semiconductor chip 200 includes a bonding pad A' where a double metal layer 108, 112 and a polysilicon film plate 104 are stacked over a first dielectric layer 102 (See FIG. 3F). The semiconductor chip 200 is wire-bonded by a beam lead 202, and then covered by an encapsulant 204. The chip package further includes an elastomer 206, a polyimide tape 208, and a solder ball 210.

Figure 5:
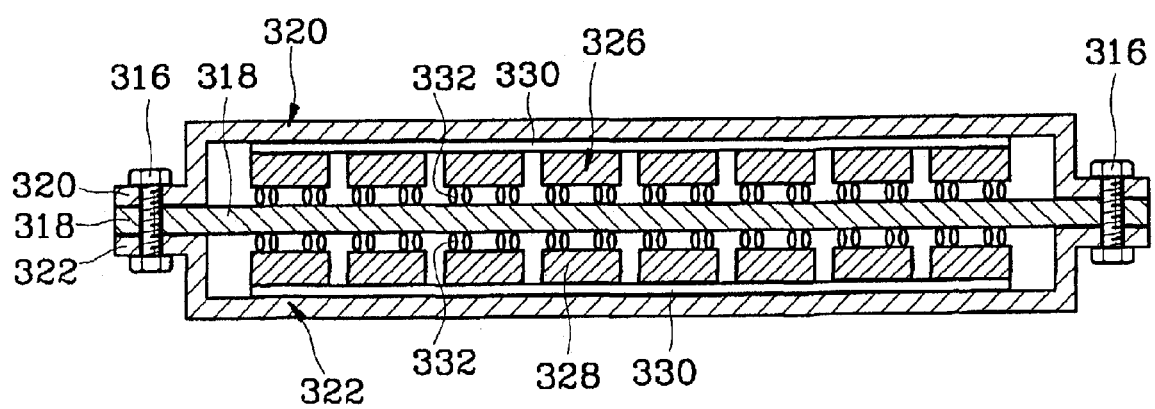
FIG. 5 is a cross-sectional view of a semiconductor module on which a semiconductor chip having a bonding pad constructed according to FIGS. 3A–3F is mounted, according to yet another aspect of the present invention.

FIG. 5 is a cross-sectional view of a semiconductor package module on which a semiconductor chip having a bonding pad of the present invention is mounted. Referring to FIG. 5, semiconductor packages 326, 328 include semiconductor chips where beam leads are wire-bonded on bonding pads having the stacked structure of a double metal layer 108, 112 and a polysilicon film plate 104 (See FIG. 3F). The semiconductor packages 326, 328 are mounted above and below a module board 318 that is wrapped by heat spreaders 320, 322. A coupling mechanism 316 is used to couple the heat spreaders 320, 322 to the module board 318. A bolt and nut (or any other coupling mechanism) can be used as the coupling mechanism 316. A solder ball 332 and an adhesive layer 330 are also provided.

In summary, according to various aspects and embodiments of the present invention, a polysilicon film plate can be formed between a first metal layer and a first dielectric layer to absorb thermo-mechanical stress induced in a bonding pad during wire bonding. As a result, the reliability of a semiconductor device can be improved. Although the invention has been described with reference to various preferred aspects and embodiments thereof, it will be apparent to those of ordinary skill in the art that various modifications and adaptations to the described embodiment may be made without departing from the spirit and scope of the invention as defined in the appended claims.

What is claimed is:

1. A bonding pad structure of a semiconductor device, said bonding pad structure comprising:
    a substructure formed on a semiconductor substrate;
    a first dielectric layer formed on the substructure;
    a polysilicon film plate formed on the first dielectric layer;
    a second dielectric layer formed overlying the polysilicon film plate, the second dielectric layer having a first opening that expose a region of the polysilicon film plate,
    a first metal layer formed on the polysilicon film plate through the first opening;
    an inter-metal dielectric (IMD) layer formed overlying the first metal layer, the inter-metal dielectric layer having a second opening that exposes a region of the first metal layer;
    a second metal layer formed on the first metal layer in the second opening; and
    a passivation layer formed overlying the second metal layer, the passivation layer having a third opening that exposes a region of the second metal layer as a bonding pad, the bonding pad positioned above and overlapping the polysilicon film plate.

2. A bonding pad structure according to claim 1, wherein the first metal layer is formed having a somewhat horseshoe-shaped cross-section.

3. A bonding pad structure according to claim 1, wherein the second metal layer has a somewhat horseshoe-shaped cross-section.

4. A bonding pad structure according to claim 1, wherein the substructure comprises circuitry configured to provide a dynamic random access memory.

5. A bonding pad structure according to claim 1, wherein the first dielectric layer is a boron phosphor silicate glass (BPSG) layer.

6. A bonding pad structure according to claim 1, wherein the first dielectric layer has a thickness of between about 3000–4000 Å.

7. A bonding pad structure according to claim 1, wherein the polysilicon film plate has a thickness of about 1000–2000 Å.

8. A bonding pad structure according to claim 1, wherein the first and second metal layers are formed of aluminum.

9. A bonding pad structure according to claim 1, wherein the first metal layer has a thickness of approximately 7000–7500 Å.

10. A bonding pad structure according to claim 1, wherein the second metal layer has a thickness of about 8500–9000 Å.

11. A bonding pad structure according to claim 1, wherein the wire bonding is beam lead bonding.

12. A semiconductor package comprising a semiconductor chip having the bonding pad structure of claim 1.

13. A semiconductor package module having a semiconductor chip mounted thereon, wherein the semiconductor chip comprises a bonding pad structure according to claim 1.

14. A bonding pad structure according to claim 2, wherein a region of the second metal layer is disposed within a recessed area of the first metal layer.

15. A bonding pad structure of a semiconductor device, said bonding pad structure comprising:
    a substructure formed on a semiconductor substrate;
    a first dielectric layer formed on the substructure;
    a polysilicon film plate formed on the first dielectric layer;

a second dielectric layer formed overlying the polysilicon film plate, the second dielectric layer having a first opening that expose a region of the polysilicon film plate, a first metal layer formed directly on the polysilicon film plate through the first opening;

an inter-metal dielectric (IMD) layer formed overlying the first metal layer, the inter-metal dielectric layer having a second opening that exposes a region of the first metal layer;

a second metal layer formed directly on the first metal layer in the second opening; and a passivation layer formed overlying the second metal layer, the passivation layer having a third opening that exposes a region of the second metal layer as a bonding pad, the bonding pad overlying the polysilicon film plate.

* * * * *